United States Patent [19]
Windus

[11] Patent Number: 4,932,038
[45] Date of Patent: Jun. 5, 1990

[54] PHASE MODULATOR CIRCUIT

[75] Inventor: Geoffrey G. Windus, Chelmsford, Great Britain

[73] Assignee: STC PLC, London, England

[21] Appl. No.: 262,696

[22] Filed: Oct. 26, 1988

[30] Foreign Application Priority Data

Nov. 18, 1987 [GB] United Kingdom ............... 8726980

[51] Int. Cl.$^5$ ............................................. H04L 25/52
[52] U.S. Cl. ....................................... 375/4; 455/601; 332/146
[58] Field of Search ............... 375/3, 4; 332/16 R, 332/16 T, 17; 455/110, 112, 113, 601; 370/13.1, 75

[56] References Cited
U.S. PATENT DOCUMENTS

| | | |
|---|---|---|
| 3,815,052 | 6/1974 | Watatani et al. ................ 332/16 T |
| 4,131,861 | 12/1978 | Malauiya ........................... 455/119 |
| 4,393,279 | 7/1983 | Cochrane et al. .................... 375/3 |
| 4,584,542 | 4/1986 | Shinbara ........................... 332/16 T |
| 4,606,049 | 8/1986 | Daniel .................................... 375/3 |
| 4,710,970 | 12/1987 | Wu et al. ............................ 455/113 |

Primary Examiner—Douglas W. Olms
Assistant Examiner—Stephen Chin
Attorney, Agent, or Firm—Lee, Mann, Smith, McWilliams & Sweeney

[57] ABSTRACT

A phase modulator circuit includes a pair of similar long-tailed pair transistor amplifiers (TR11, TR12 and TR13, TR14) to which sinusoidal signals are fed. The transistor pairs form the collection loads of a further long tailed pair (TR21, TR22) fed with a modulator signal. The circuit generates an output of constant amplitude but modulated in phase in correspondence with the modulated signal. The circuit may be used in the supervisory unit of a telecommunication repeater.

2 Claims, 3 Drawing Sheets

PHASE MODULATOR CIRCUIT

This invention relates to phase modulator circuits e.g. for use in submarine telecommunications repeaters.

BACKGROUND OF THE INVENTION

Telecommunications repeaters or regenerators and in particular optical repeaters, require associated supervisory circuitry to monitor operation and to ensure that the device is functioning correctly. Output signals from the supervisory circuit are impressed on the output signal from the repeater or regenerator as a phase modulation of the digital data stream. This modulation may be achieved by phase modulation of sinusoidal signals generated by a clock within the repeater. Conventional phase modulation circuits suffer from the disadvantage that their output signal varies significantly in amplitude. Under the stringent conditions of repeater operation this amplitude variation is considerable.

The object of the present invention is to minimise or to overcome this disadvantage.

SUMMARY OF THE INVENTION

According to the invention there is provided a phase modulator circuit, including a pair of similar amplifiers each having a pair of inputs to which, in use, sinusoidal signals are fed, and means for applying a control signal to the circuit, the arrangement being such that, in use, a sinusoidal output signal, phase modulated in correspondence with the control signal, and of substantially constant amplitude is provided.

According to the invention there is further provided a phase modulator circuit for a telecommunications repeater, the circuit including first and second transistor long tailed pair amplifiers each having a pair of inputs to which in use sinusoidal signals are fed, emitter resistors one for each said transistor, a further transistor long tailed pair, coupled between the emitter resistors and, via a current source, the circuit ground, and means for applying control signals to the transistors of the further long tailed pair whereby, in use, to provide a sinusoidal output phase modulated in response to the control signals, and wherein the values of the emitter resistors are substantially equal and are said that such output phase modulated signal is of substantially constant amplitude.

A plurality of said circuits may be employed in a telecommunications system.

BRIEF DESCRIPTION OF THE DRAWINGS

An embodiment of the invention will now be described with reference to the accompanying drawings in which.

DESCRIPTION OF PREFERRED EMBODIMENT.

Figure 1:
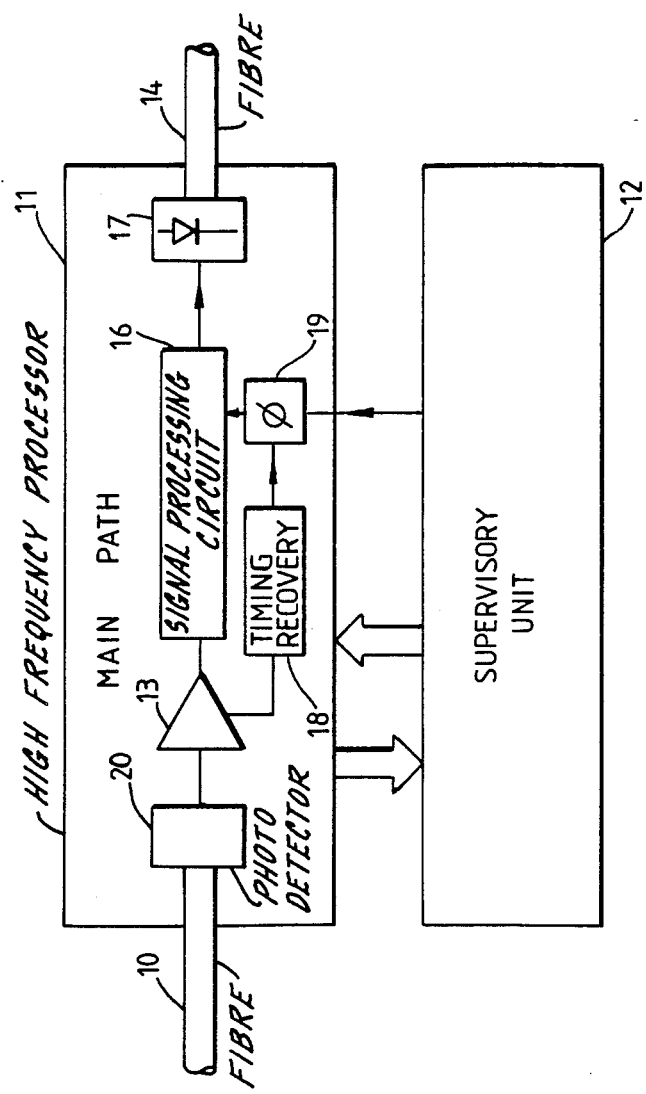
FIG. 1 is a schematic diagram of a submarine telecommunications repeater or regenerator.

Referring to FIG. 1, the repeater, which is shown in highly schematic form, comprises a high frequency signal processor 11 and a low frequency supervisory unit 12. Optical signals received via input fibre 10 are regenerated by the high frequency processor and output to fibre 14. The optical signals are in digital form.

Input optical signals received by the processor 11 are coupled via a photodetector 20 to amplifier 13. The amplified signals are fed via signal processing circuitry 16 to a laser 17 where they are reconverted to optical form for transmission to fibre 14. Retiming of the output signal is provided by a timing recovery circuit 18 which circuit generates sinusoidal clock signals at a frequency determined by the input signal baud rate. The clock signals are fed to the signal processing circuit 16 via a phase modulator circuit 19 the operation of which will be described below.

Operation of the high frequency processor 11 is monitored by the low frequency supervisory unit 12. Control signals for operation of the supervisory unit are contained in the coding of the input data stream. The control signals are recovered from the data stream by the high frequency processor and fed to the supervisory unit. In response to these signals the supervisory unit monitors the processor for correct operation e.g. by measuring received optical powers and detecting line errors. Signals corresponding to the information obtained by these measurements are fed to the processor for transmission via the output fibre 14 to a remote station for analysis.

The signals from the supervisory circuit 12 are encoded on the output data stream as phase modulation, i.e. in the inherent timing rate of the data stream. This is achieved by the phase modulator circuit 19 which introduces a phase modulation of the sinusoidal clock provided by the timing recovery circuit 18 which is used to retime the regenerated data. The corresponding variation of the output signal is demodulated at the remote station to recover the supervisory signals.

Figure 2:
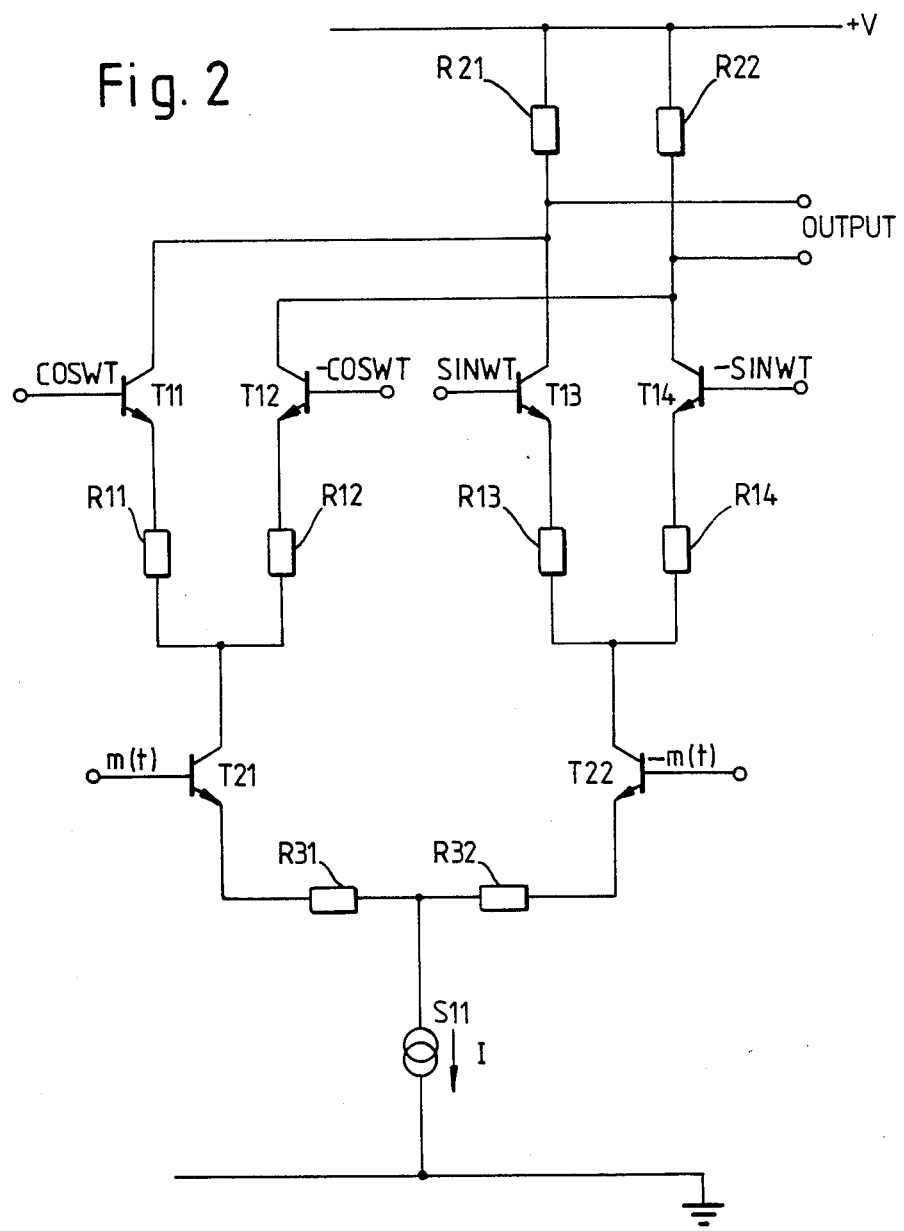
FIG. 2 shows a phase modulation circuit for use in the repeater of FIG. 1.

Referring now to FIG. 2 the phase modulator circuit includes first and second long tailed transistor pairs T11, T12 and T13, T14. Each transistor has a respective resistor, R11 to R14, in series with its emitter. Load resistors R21 and R22 provide shared or common collector loads for the left hand transistors T11, T13 and the right hand transistor T12, T14 respectively of the long tailed pairs. The two long tailed pairs form the collector loads of a further long tailed transistor pair T21 and T22. The emitters of this further transistor pair are coupled to the circuit ground via emitter resistors R31 and R32 and current source S11.

The circuit shown in FIG. 2 accepts sine and cosine inputs to the base terminals of transistors T11, T13 and T12, T14 respectively. These inputs may be in balanced or unbalanced form. Modulation waveforms, m(t) and −m(t) respectively, are fed to the base terminals of transistors T22 and T21 of the further long tailed pair. The circuit outputs are taken from the common collectors of transistors T11 and T13 and from the common collectors of transistors T12 and T14.

The gain of the first and second long tailed pairs is so controlled that their resultant outputs are of substantially constant amplitude over the full 90° range of the modulator. Typically the outputs are constant to within 0.2 dB. This is achieved by selection of the values of the emitter resistors R11 and R14 which are of equal value and determined by the expression, $$X \times R = C$$

where I is the current, in milliamps, generated by the current source, and C is a constant with the range 50 to 80. Preferably C is 60 to 70.

Figure 3:
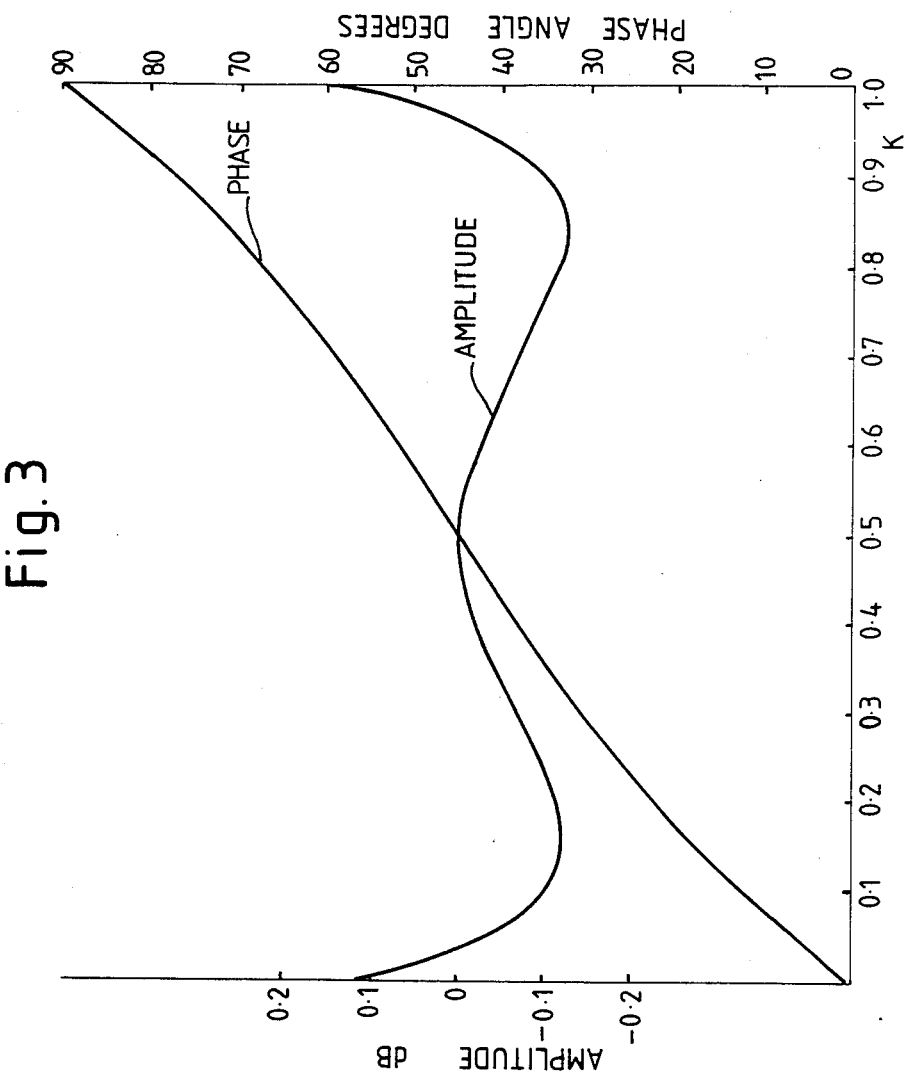
FIG. 3 illustrates the output characteristics of the circuit of FIG. 2.

The output of the phase modulator circuit is the sum of two sinusoidal inputs that are added in proportions controlled by the modulation input. The resultant output amplitude is substantially constant. The output phase is substantially a linear function of the modulation voltage. The performance of the circuit is illustrated in FIG. 3 which shows a typical set of transfer characteristics for the case where $I \times R = 65$.

The graph illustrates the phase and amplitude variation of the output signal as a function of the current sharing factor K between the two long tailed pair amplifiers. A value of $K=0$ represents the condition where all the current flows through one amplifier while the value $K=1$ reprsents the condition where all the current flows through the other amplifier. Current is shared equally when $K=0.5$. The value of K is determined by the modulating signal.

The phase modulator circuit described herein is particularly suitable for integration either as a single circuit or as part of a larger VLSI circuit.

It will be appreciated that although the pulse modulator circuit has been described with particular reference to telecommunications repeaters, its use is not limited to this application.

I claim:

1. A digital telecommunications repeater, including means for receiving a digital input pulse stream, a high frequency processor for regenerating said input digital pulse stream and providing a main signal path for said pulse stream, means for outputting said regenerated pulse sream, a timing recovery circuit arranged to generate sinusoidal clock signals at a frequency determined by the input signal baud rate, a phase modulator circuit whereby said clock signals are coupled to the main signal path, and a low frequency supervisory circuit associated with the high frequency processor and arranged to provide signals to the phase modulator whereby said sinusoidal clock signals are phase modulated, wherein the phase modulator circuit comprises first and second long tailed transistor pairs, the transistor base terminals of each pair providing inputs to which said clock signals are coupled, there being emitter resistors one for each said transistor, wherein said first and second long tailed transistor pairs provide each a collector load for a further long tailed transistor pair, the transistor emitters of said further pair being coupled to ground via respective further emitter resistors and a current source, and wherein said resistors are of substantially equal value (R), said value being given by the expression $$I \times R = C$$

where I is the current, in milliamps, generated by the current source and C is a constant factor having a value in the range 50 to 80, the phase modulator being such that the phase modulated signal coupled to the main signal path is of substantially constant amplitude.

2. A telecommunications system provided with a plurality of digital repeaters as claimed in claim 1.

* * * * *